United States Patent
Tsai et al.

(10) Patent No.: US 9,101,069 B2
(45) Date of Patent: Aug. 4, 2015

(54) FIXING DEVICE AND PLATE ASSEMBLY USING THE SAME

(71) Applicant: HON HAI PRECISION INDUSTRY CO., LTD, New Taipei (TW)

(72) Inventors: Ming-Chun Tsai, New Taipei (TW); Ming-Chien Chiu, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 52 days.

(21) Appl. No.: 13/912,210

(22) Filed: Jun. 7, 2013

(65) Prior Publication Data

US 2014/0314518 A1    Oct. 23, 2014

(30) Foreign Application Priority Data

Apr. 23, 2013  (TW) .............................. 102114307 U

(51) Int. Cl.
*F16B 43/02* (2006.01)
*H05K 7/14* (2006.01)

(52) U.S. Cl.
CPC ...................................... *H05K 7/142* (2013.01)

(58) Field of Classification Search
USPC .................... 411/544, 509, 510; 24/292, 458; 403/220, 226, 227; 361/758, 770; 248/635
See application file for complete search history.

(56) References Cited

U.S. PATENT DOCUMENTS

| | | | | |
|---|---|---|---|---|
| 2,666,972 A | * | 1/1954 | Strobel | 248/635 |
| 4,074,491 A | * | 2/1978 | Bell et al. | 52/394 |
| 4,289,061 A | * | 9/1981 | Emmett | 411/34 |
| 4,889,457 A | * | 12/1989 | Hageman | 411/10 |
| 5,098,765 A | * | 3/1992 | Bien | 428/134 |
| 5,158,269 A | * | 10/1992 | Hein et al. | 267/220 |
| 5,207,546 A | * | 5/1993 | Bouverie | 411/553 |
| 5,222,718 A | * | 6/1993 | Buck | 267/162 |
| 5,308,205 A | * | 5/1994 | Lautenschlager | 411/182 |
| 7,510,163 B2 | * | 3/2009 | Schlitzkus et al. | 248/635 |
| 7,762,506 B2 | * | 7/2010 | Beshore | 248/188.9 |
| 8,116,087 B2 | * | 2/2012 | Lo | 361/759 |
| 8,192,102 B2 | * | 6/2012 | Heidari et al. | 403/2 |

FOREIGN PATENT DOCUMENTS

| | | |
|---|---|---|
| DE | 19809630 A1 | 9/1999 |
| TW | M350969 U | 2/2009 |

* cited by examiner

*Primary Examiner* — Gary Estremsky
(74) *Attorney, Agent, or Firm* — Novak Druce Connolly Bove + Quigg LLP

(57) ABSTRACT

An exemplary fixing device includes an elastically deformable sleeve and a screw extendable through the sleeve. The sleeve includes a hollow column and multiple flanges extending outwardly from an outer circumferential face of the column. A plate assembly incorporating the fixing device is also provided.

18 Claims, 7 Drawing Sheets

FIXING DEVICE AND PLATE ASSEMBLY USING THE SAME

BACKGROUND

1. Technical Field

The disclosure generally relates to fixing devices for attaching things together, and particularly to a fixing device for securing a printed circuit board to a panel.

2. Description of Related Art

Generally, various electronic components are mounted on a printed circuit board of an electronic device. The printed circuit board is then fixed to a support (such as a flat plate of a computer enclosure) by screws for supporting the electronic components. However, besides the typical flat shape of many supports, some supports have an irregular shape. For example, the support may include two flat plates inclined relative to each other. It is difficult to firmly and reliably fix the printed circuit board on the two inclined plates just by screws, and this can make the process of assembling the printed circuit board to the support problematic.

What is needed, therefore, is a means which can address the limitations described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the various views.

DETAILED DESCRIPTION

Figure 1:
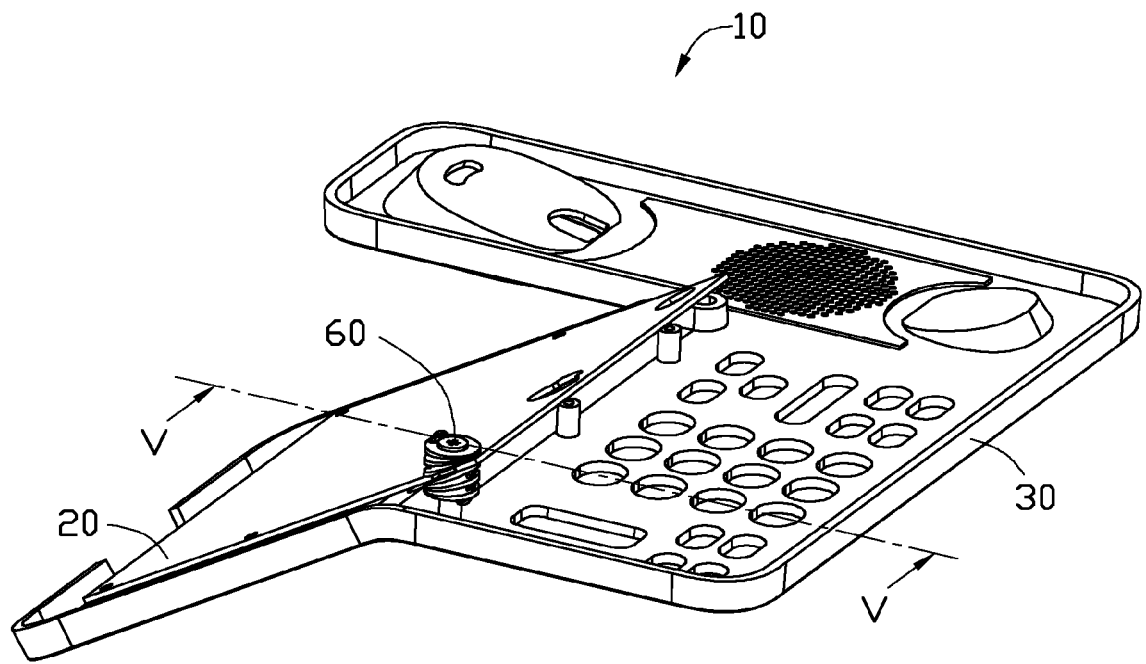
FIG. 1 is an isometric view of a plate assembly in accordance with an eclectic embodiment of the present disclosure

Referring to FIG. 1, a plate assembly 10 in accordance with an eclectic embodiment of the present disclosure is shown. The plate assembly 10 includes an panel 30, a first plate 20 disposed on the panel 30, and three fixing devices 60 fixing the first plate 20 on the panel 30. For simplicity, only one fixing device 60 is shown in the drawings and described herein. Furthermore, in the following description, unless the context indicates otherwise, references to "top," "bottom," "upper," "lower," "left" and "right" refer to positions and/or orientations as viewed in the drawings.

Figure 2:
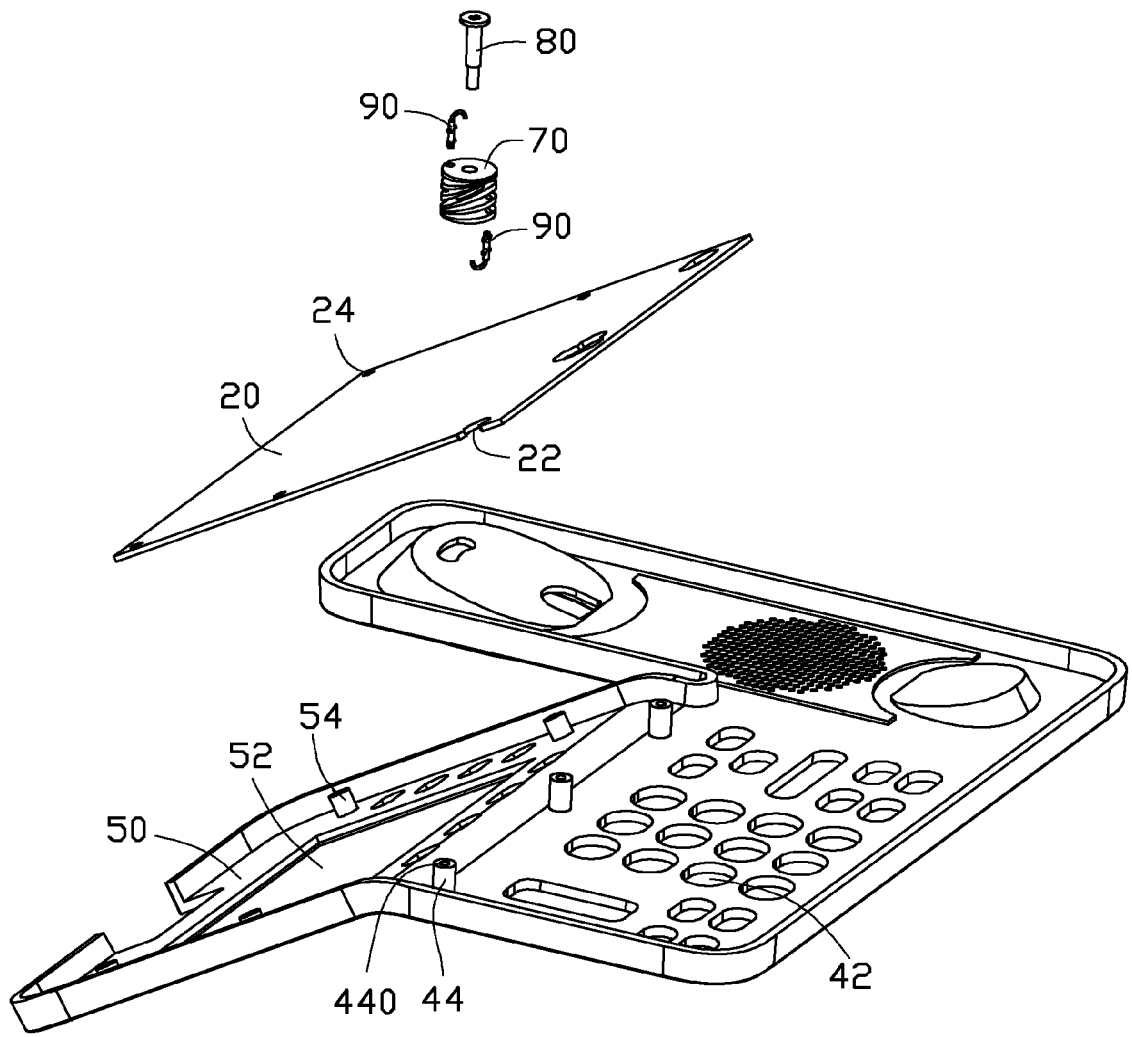
FIG. 2 is an exploded view of the plate assembly of FIG. 1.
Figure 5:
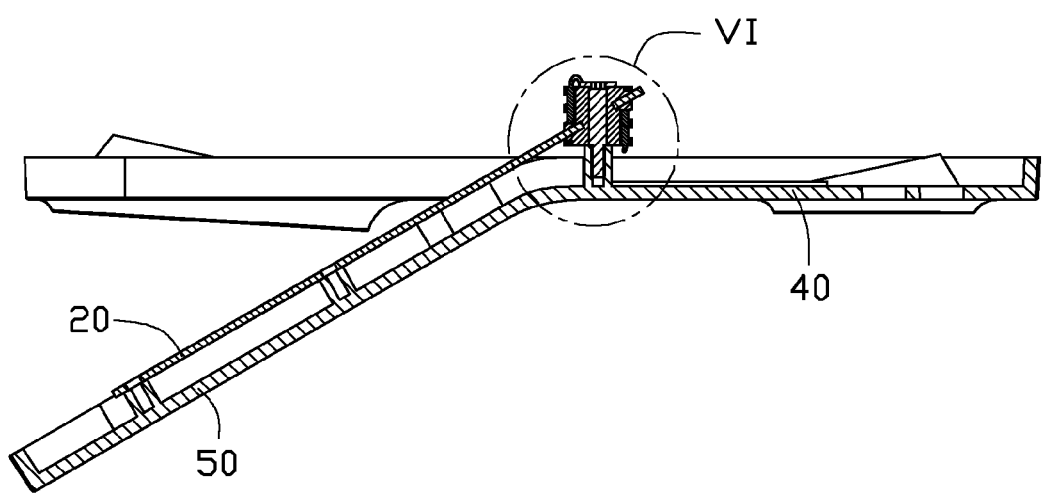
FIG. 5 is a cross section of the plate assembly of FIG. 1, taken along line V-V thereof.

Also referring to FIGS. 2 and 5, the panel 30 includes a second plate 40 and a third plate 50 connected to the second plate 40. The second plate 40 is orientated horizontally, and defines a plurality of holes 42 therein. Three first posts 44 protrude upwardly from a top face of the second plate 40. The first posts 44 are located adjacent to a boundary of the second plate 40 and the third plate 50. For simplicity, unless the context indicates otherwise, only one of the first posts 44 will be described hereinafter. The first post 44 has a threaded hole 440 defined in a top face thereof. The third plate 50 is inclined relative to the second plate 40. In this embodiment, an angle between a top face of the third plate 50 and the top face of the second plate 40 is larger than 180 degrees and less than 270 degrees. The third plate 50 defines a window 52 in a central area thereof. A plurality of second posts 54 are formed on the top face of the third plate 50.

Figure 4:
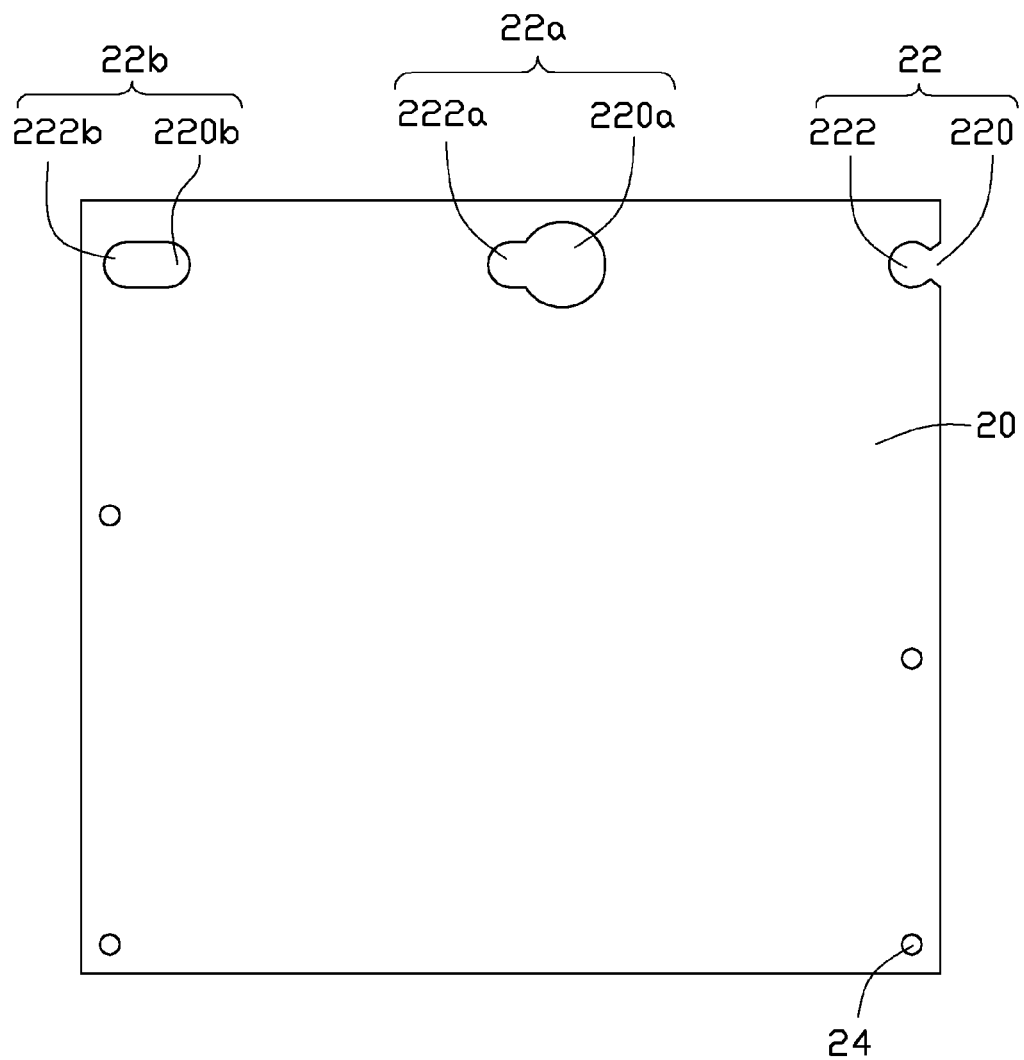
FIG. 4 is a top plan view of a first plate of the plate assembly of FIG. 2.

Also referring to FIG. 4, the first plate 20 is parallel to the third plate 50 and inclined relative to the second plate 40. In this embodiment, the first plate 20 is a printed circuit board. The first plate 20 has three fixing holes 22, 22a, 22b defined along one side thereof, corresponding to the first posts 44 of the second plate 40. The fixing hole 22 is defined in a side edge of the first plate 20 adjacent to the side of the first plate 20 having the three fixing holes 22, 22a, 22b. The fixing hole 22 includes a first portion 220, and a second portion 222 communicating with the first portion 220. The first portion 220 has a width gradually decreasing from the edge of the first plate 20 towards the second portion 222. The second portion 222 has a substantially circular shape. A width of the fixing hole 22 at a boundary of the first portion 220 and the second portion 222 is less than that at the other positions of the fixing hole 220. The first plate 20 further defines a plurality of mounting holes 24 near a periphery thereof. The mounting holes 24 correspond to the second posts 54 of the third plate 50. Screws (not shown) extend through the mounting holes 24 into the second posts 54 to fix the first plate 20 to the third plate 50.

Figure 3:
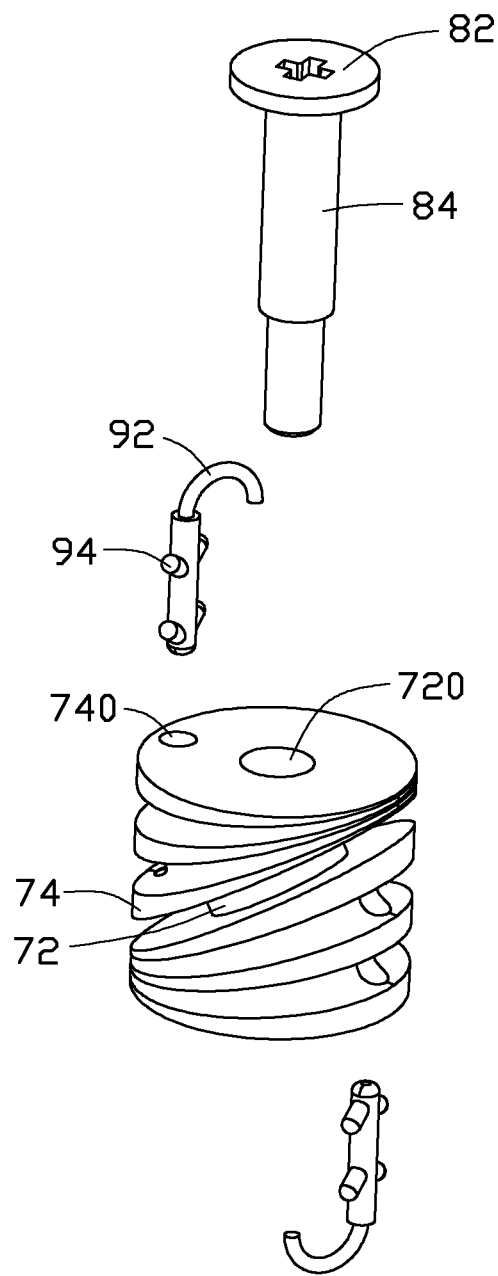
FIG. 3 is an enlarged view of a fixing device of the plate assembly of FIG. 2.
Figure 7:
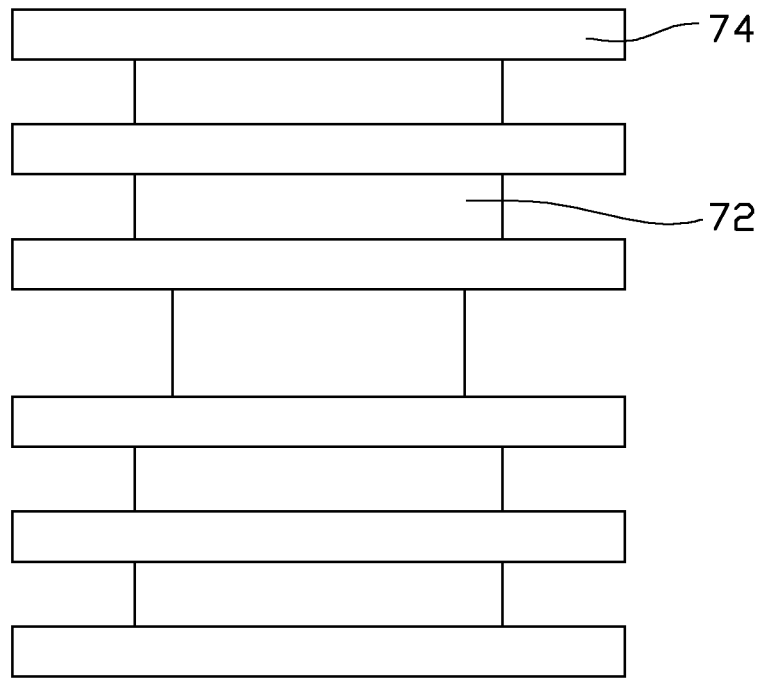
FIG. 7 is an enlarged, side plan view of a sleeve of the fixing device of FIG. 2, but showing the sleeve in a free (undeformed) state.

Also referring to FIGS. 3 and 7, the fixing device 60 includes a sleeve 70 and a screw 80 extending through the sleeve 70. The sleeve 70 may be made of soft and elastically deformable material such as rubber. The sleeve 70 includes a hollow column 72, and a plurality of flanges 74 formed on an outer circumferential face of the column 72. The column 72 defines a through hole 720 from a top face of the sleeve 70 to a bottom face of the sleeve 70, for receiving the screw 80. The column 70 has a smallest outer diameter at a middle portion along a height direction thereof. The flanges 74 are parallel to each other, with intervals between every two adjacent flanges 74 (see FIG. 7). In this embodiment, the flanges 74 are annular. There are three upper flanges 74 located above the middle portion of the column 72, and three lower flanges 74 located below the middle portion of the column 72. The middle portion of the column 72 has an outer diameter less than a diameter of the second portion 222 of the fixing hole 22. Each flange 74 has an outer diameter larger than the diameter of the second portion 222 of the fixing hole 22. The sleeve 70 is retained in the first plate 20 by way of the middle portion of the column 72 being pushed from the first portion 220 into the second portion 222 of the fixing hole 22. The first plate 20 is thus sandwiched between two flanges 74 adjacent to the middle portion of the column 72.

The screw 80 includes a head 82, and a pole 84 extending downwardly from the head 82. The head 82 has a diameter larger than that of the through hole 720 of the sleeve 70, and the pole 84 has a diameter less than that of the through hole 720 of the sleeve 70. The pole 84 extends through the through hole 720 of the sleeve 70 into the first post 44 of the second plate 40, thereby fixing the first plate 20 to the second plate 40.

Figure 6:
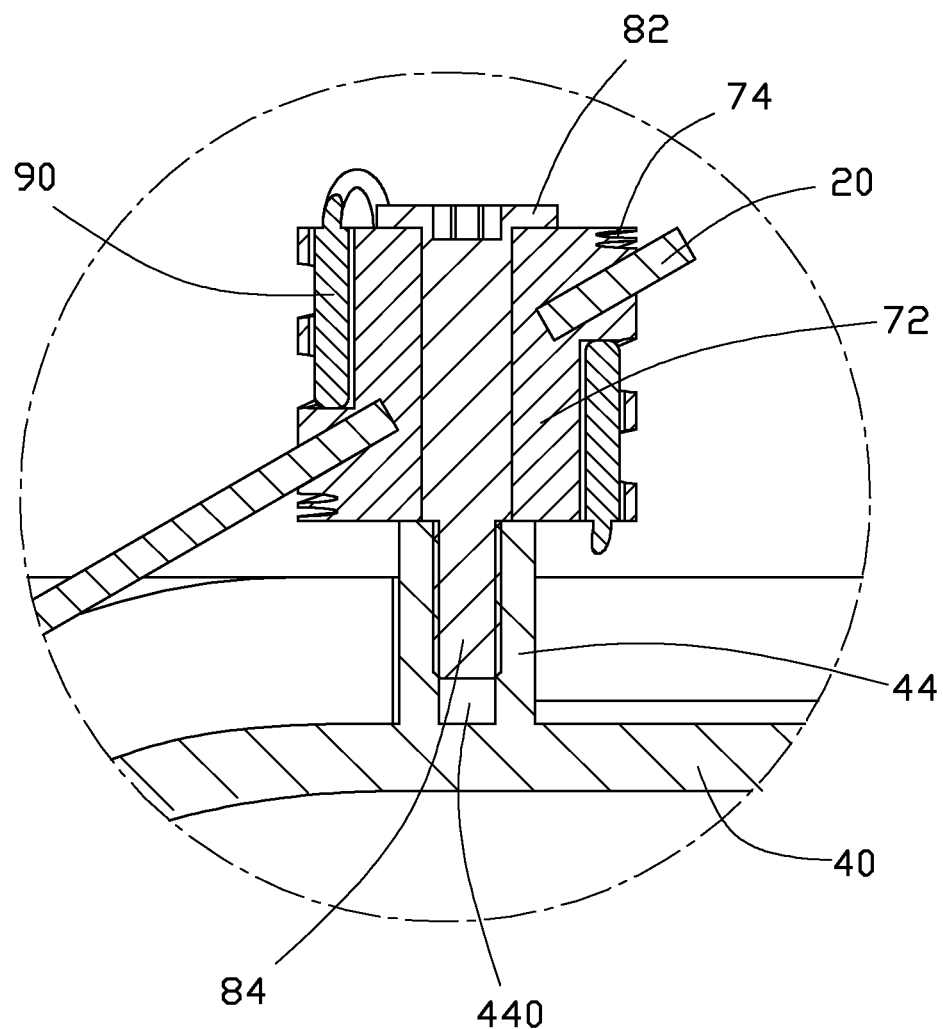
FIG. 6 is an enlarged view of a circled part VI of FIG. 5.

Also referring to FIG. 6, in assembly of the plate assembly 10, the sleeve 70 is retained in the fixing hole 22 of the first plate 20 beforehand. The first plate 20 is then disposed on the third plate 50. The mounting holes 24 of the first plate 20 are respectively aligned with the second posts 54 of the third plate 50, and the sleeve 70 is located just above the corresponding first post 44 of the second plate 40. The screws (not shown) are extended through the mounting holes 24 of the first plate 20 into the second posts 54 of the third plate 50 to fix the first plate 20 to the third plate 50. The screw 80 is extended downwardly through the sleeve 70 into the threaded hole 440 of the first post 44 of the second plate 40. The upper flanges 74 are pressed by the head 82 of the screw 80 and deform. Right ends of the deformed upper flanges 74 abut against each other, and resiliently press against a top face of the first plate 20 in a direction towards the second plate 40. Left ends of the deformed upper flanges 74 remain spaced from each other. The lower flanges 74 are pressed by a bottom face of the first plate 20 and deform. Left ends of the deformed lower flanges 74 abut against each other, and resiliently press against the bottom face of the first plate 20 in an upward direction. Right ends of the deformed lower flanges 74 remain spaced from each other. Thus, the first plate 20 is fixed to the second plate 40 by the sleeve 70 and the screw 80.

In order to reinforce the sleeve 70, two latches 90 are provided on the sleeve 70. Each latch 90 includes a wire 92, and a plurality of hooks 94 formed on the wire 92. The wire 92 of an upper one of the latches 90 connects the top face of the sleeve 70, and the wire 92 of a lower one of the latches 90 connects the bottom face of the sleeve 70. The hooks 94 of the upper latch 90 extend upwardly and inclinedly from an outer circumferential face of the wire 92, and the hooks 94 of the lower latch 90 extend downwardly and inclinedly from an outer circumferential face of the wire 92. The upper latch 90 extends through apertures 740 defined in the left ends of the upper flanges 74, and the lower latch 90 extends through apertures 740 defined in the right ends of the lower flanges 74. The hooks 94 of the upper latch 90 press upwardly against bottom faces of the left ends of the upper flanges 74, and the hooks 94 of the lower latch 90 press downwardly against top faces of the right ends of the lower flanges 74. Thereby, the sleeve 70 is reinforced by the two latches 90 to achieve more reliable engagement of the first plate 20 with the second plate 40.

FIG. 4 also shows two alternative types of fixing holes, namely the fixing holes 22a, 22b. The first alternative type of fixing hole 22a includes a first portion 220a, and a second portion 222a communicating with the first portion 220a. The first portion 220a is substantially circular, and has a diameter larger than that of the flange 74. The second portion 222a has a diameter less than that of the flange 74, and larger than that of the middle portion of the column 72. The sleeve 70 can be mounted in the fixing hole 22a by inserting the sleeve 70 into the first portion 220a, and then moving the sleeve 70 into the second portion 222a from the first portion 220a. The second alternative type of fixing hole 22b includes a first portion 220b, and a second portion 222b communicating with the first portion 220b. The first portion 220b and the second portion 222b are symmetrical with each other. Each of the first portion 220b and the second portion 222b has a maximum diameter less than that of the flange 74, and a minimum diameter larger than that of the middle portion of the column 72. The sleeve 70 can be mounted into the second portion 222b of the fixing hole 22b by directly inserting the sleeve 70 into the second portion 222b. During this process, the lower flanges 74 (or alternatively the upper flanges 74) of the sleeve 70 are squeezed by edges of the first plate 20 surrounding the second portion 222b, and thereby deform such that the lower flanges 74 can pass through the second portion 222b. Then when the lower flanges 74 extend below the second portion 222b, the lower flanges 74 elastically recover to their original shapes. The first plate 20 is thus sandwiched between the two flanges 74 adjacent to the middle portion of the column 72.

It is to be understood, however, that even though numerous characteristics and advantages of the present embodiments have been set forth in the foregoing description, together with details of the structures and functions of the embodiments, the disclosure is illustrative only; and changes may be made in detail, especially in matters of shape, size, and arrangement of parts within the principles of the invention to the full extent indicated by the broad general meaning of the terms in which the appended claims are expressed.

What is claimed is:

1. A fixing device comprising:
   an elastically deformable sleeve comprising a hollow column and a plurality of flanges extending outwardly from an outer circumferential face of the column;
   a latch fixed to the sleeve, the latch comprising a wire connecting the sleeve and a plurality of hooks formed on the wire; and
   a screw extendable through the column of the sleeve.

2. The fixing device of claim 1, wherein the flanges are parallel to each other.

3. The fixing device of claim 2, wherein the flanges are spaced from each other.

4. The fixing device of claim 1, wherein the wire extends through at least two of the flanges.

5. The fixing device of claim 4, wherein the plurality of hooks abut against a corresponding plurality of the flanges.

6. The fixing device of claim 1, wherein the column has a smallest outer diameter at a middle portion along a height direction thereof.

7. A plate assembly comprising:
   a first plate defining a fixing hole therein;
   a second plate inclined relative to the first plate; and
   a fixing device comprising an elastically deformable sleeve and a screw, the sleeve comprising a column and a plurality of flanges formed on an outer circumferential face of the column;
   wherein the column is retained in the fixing hole of the first plate, the screw extends through the column of the sleeve and is engaged with the second plate, and the flanges are squeezed and deformed by the screw and press the first plate towards the second plate,
   wherein the flanges squeezed by the screw have ends abutting against each other.

8. The plate assembly of claim 7, wherein the flanges squeezed by the screw have opposite ends spaced at distances from each other.

9. The plate assembly of claim 8, wherein a middle portion of the column along a height direction thereof is retained in the fixing hole.

10. The plate assembly of claim 9, wherein the flanges are located above the middle portion of the column.

11. The plate assembly of claim 10, further comprising a plurality of flanges located below the middle portion of the column, wherein the first plate is sandwiched between two flanges adjacent to the middle portion of the column.

12. The plate assembly of claim 7, further comprising a post protruding upwardly from the second plate, wherein the screw has an end inserted in the post to engage with the second plate.

13. The plate assembly of claim 12, further comprising a third plate connecting the second plate, wherein the third plate is parallel to the first plate.

14. The plate assembly of claim 13, wherein the first plate is disposed on the third plate.

15. The plate assembly of claim 13, wherein a panel comprises the second plate and the third plate.

16. The plate assembly of claim 13, wherein the post is located adjacent to a boundary of the second plate and the third plate.

17. The plate assembly of claim 7, wherein the fixing device further comprises a latch connecting the sleeve, and the latch comprises a wire having an end extending from the sleeve, and an opposite end inserted to the flanges.

18. The plate assembly of claim 17, wherein the latch further comprises a plurality of hooks formed on the opposite end of the wire, and the hooks abut against the flanges upwardly.

* * * * *